United States Patent
Sippola et al.

(10) Patent No.: US 7,116,076 B2
(45) Date of Patent: Oct. 3, 2006

(54) FILTER NETWORK FOR MOTOR CONTROL SYSTEMS

(75) Inventors: Mika Sippola, Helsinki (FI); Peter Kull-Bucher, Rüttenen (CH)

(73) Assignee: Schaffner EMV AG, Luterbach (CH)

( * ) Notice: Subject to any disclaimer, the term of this patent is extended or adjusted under 35 U.S.C. 154(b) by 0 days.

(21) Appl. No.: 11/179,566

(22) Filed: Jul. 13, 2005

(65) Prior Publication Data

US 2005/0275368 A1 Dec. 15, 2005

Related U.S. Application Data

(63) Continuation of application No. PCT/EP03/50210, filed on Jun. 3, 2003.

(30) Foreign Application Priority Data

Jan. 20, 2003 (EP) .................... 03001097

(51) Int. Cl.
*H02P 1/24* (2006.01)

(52) U.S. Cl. .............. 318/727; 318/811; 318/254; 318/611; 363/40; 363/52

(58) Field of Classification Search ........... 318/727, 318/800, 811, 254, 439, 611; 363/40, 41, 363/52

See application file for complete search history.

(56) References Cited

U.S. PATENT DOCUMENTS

| | | | | |
|---|---|---|---|---|
| 4,812,669 A | * | 3/1989 | Takeda et al. ............... 307/105 |
| 5,345,375 A | * | 9/1994 | Mohan .......................... 363/40 |
| 5,526,252 A | * | 6/1996 | Erdman ......................... 363/41 |
| 5,686,806 A | | 11/1997 | Hibbard |
| 5,731,666 A | | 3/1998 | Folker et al. |
| 5,949,221 A | * | 9/1999 | Edwards ....................... 323/209 |
| 5,990,654 A | * | 11/1999 | Skibinski et al. ............ 318/800 |
| 6,246,209 B1 | | 6/2001 | Kim |
| 2002/0125034 A1 | | 9/2002 | Kuo |
| 2005/0275368 A1 | | 12/2005 | Sippola et al. |

FOREIGN PATENT DOCUMENTS

| | | |
|---|---|---|
| EP | 0 758 161 | 2/1997 |
| EP | 1 411 621 | 4/2004 |
| JP | 08182193 | 7/1996 |

OTHER PUBLICATIONS

A.F. Moreira, T.A. Lipo, G. Venkataramanan, S. Bernet, "Modeling and Evaluation of dv/dt Filters for AC Drives with High Switching Speed", EPE 2001—Graz, pp. 1-14, XP-001052038.

* cited by examiner

*Primary Examiner*—Rina Duda
(74) *Attorney, Agent, or Firm*—Blank Rome LLP

(57) ABSTRACT

Filter network for the reduction of the voltage switching speed between an electrical motor drive and an electrical motor and/or between an electrical distribution network and a motor drive, comprising for each electrical phase a self-damped inductor having a complex impedance determined by a magnitude (Z) and a phase (φ), the phase (φ) of the complex impedance being comprised between 80 and 90 degrees in the frequency range of the motor's current, and being less than 60 degrees in the frequency range of the overvoltage oscillations. Using the inventive filter network, it is possible to manufacture low cost and small size du/dt-filters generating low voltage overshoot and low losses.

20 Claims, 6 Drawing Sheets

FILTER NETWORK FOR MOTOR CONTROL SYSTEMS

REFERENCE DATA

This application is a continuation of International Patent Application PCT/EP2003/050210 (WO2004/066492) filed on Jun. 3, 2003, claiming priority of European patent application EP03001097.9 of Jan. 20, 2003, the contents whereof are hereby incorporated.

FIELD OF THE INVENTION

The present invention relates to a filter network for avoiding overvoltages due to transmission line effects and/or impedance discontinuities at the inputs of a motor connected with a cable to a motor drive and/or between a motor drive and an electrical distribution network.

DESCRIPTION OF RELATED ART

Frequency converters such as for example adjustable speed motor drives (ASD) are widely used today for controlling motors such as for example induction or permanent magnet motors. In most cases, pulse width modulation (PWM) is used for adjusting the desired motor operation: a DC voltage is chopped by power semiconductors such as Insulated Gate Bipolar Transistors (IGBT) in order to generate a series of pulses of different widths, the average of which corresponds to the required voltage. In such a motor drive, the power semiconductors are thus used as ON/OFF-switches.

In practice, these switches are not ideal: they have power losses during their ON-state and they can't be switched from their OFF to their ON-state and back with an infinite speed, thus resulting into switching losses. In order to reduce the switching losses, the usual solution is to use faster switching power semiconductors. Today's fast power semiconductors typically switch the drive's output voltage at a speed around 3000V/μs. Such a high switching speed results, in the typical case of a DC voltage of 560V, into switching times of 200 ns or less between two discrete voltage values.

A typical waveform for the output voltage of an ASD is illustrated in FIG. 1. In this example, the voltage switching speed, which can be expressed as the value of the voltage derivative du/dt, is approximately 3000V/μs.

Although high speed switching allows the reduction of switching losses, it has some drawbacks when considering a complete installation comprising a motor drive, electrical cables and a motor.

Firstly, high speed voltage switching stresses the motor and the electrical cables by driving capacitive currents into their insulations and bearings:

$$I_{capacitive} = C \cdot \frac{du}{dt},$$

where C is the capacitance of these insulations and/or bearings towards the ground. Capacitive currents may also contribute to the electromagnetic interference (EMI) of the installation, thus generate electromagnetic perturbations for the neighboring devices.

Secondly, and sometimes more importantly, high speed switching can give rise to significant overvoltage oscillations at the motor end of the cable connecting the motor to the drive, particularly in the case of a long cable, which can lead to motor damages and/or to the breakdown of the cable's insulation.

The reason for these overvoltage oscillations are the so called transmission line effects: in a long cable, the voltage during power switching can't be considered as constant over the entire cable. The voltage must be considered as a signal needing some time to travel from the cable's input to the cable's output, typically at the speed of 0.8*light speed. Under such conditions, impedance discontinuities within the transmission line will cause voltage reflections leading to overvoltages as they add with the originally transmitted waveform.

It can be approximated that, if the travel time of the voltage within the cable is longer than the half of the voltage's rise time at the cable's input, the voltage at the motor's end of the cable can oscillate up to twice the value of the voltage at the cable's input. For example, with a typical rise time of 200 ns at the motor drive's output, the value of the overvoltage at the motor's end of a 24 meters long cable is approximately twice the value of the DC-link voltage: 2*560V=1120V. This overvoltage problem is even more severe with a 690V mains network systems where the DC voltage may be 1100V, potentially resulting into overvoltage oscillations of 2200V while the maximum permissible motor voltage in many applications is typically only 1500V.

FIG. 2 represents for example the voltage measured at the input of a motor connected with a 200 meters long cable to an ASD having the output voltage illustrated in FIG. 1. The overvoltage oscillations, due to the transmission line effects as well as to the impedance discontinuity between the cable and the motor, reach in this example a maximum voltage of 1000V.

A solution to avoid overvoltages at the motor's end would be to keep the switching speed du/dt of the drive's output voltage below a critical value depending on the characteristics of the entire system. From the approximation given above, it can be calculated for example that with a 200 meter long cable between the drive and the motor and with a DC-link voltage of 560 Volts, significant overvoltages would already appear with a du/dt-value of 336V/μs. The switching speed of the motor drive's power semiconductors should thus be lower than this value in order to avoid overvoltages during system operation. This solution however has the drawback that significant switching losses are present. Moreover, setting the characteristics of the drive's elements is not always possible and/or desired.

In patent application CH1724/02, now EP 1411621, it has been suggested to prevent or eliminate the overvoltages by using an impedance matching network or a clamping circuitry typically comprising resistors, capacitors and/or zener diodes at the motor's terminals. Although such termination networks at the motor's end are well adapted for many applications, they are usually very lossy, thus releasing a lot of heat, and difficult to install near the motor.

It has thus been noted within the frame of the invention that the most attractive solution to prevent and/or reduce overvoltages is to use a so-called du/dt-filter, usually placed between the motor drive's outputs and the cable's input for reducing the voltage switching speed du/dt in the cable.

In it's simplest form, such a du/dt-filter consists of one inductor, also known as choke, connected between each of the drive's output phases and the corresponding cable phase. Capacitors are often added on the cable's side, connecting the chokes' outputs to each other or to the ground or neutral conductor, in order to adjust the du/dt-value and thus stabilize the operation of the filter for example with different cable lengths. Such du/dt-filters effectively reduce the du/dt-value and at the same time reduce the currents responsible for electromagnetic interference.

A schematic of a typical prior art du/dt-filter is illustrated in FIG. 3. Out of simplicity, only one of the possibly two, three or more phases is shown. The drive is to be connected to the left side of the choke 10, while the cable will be connected to the right side of the choke 10, to the capacitor 20 and choke 10 connection point. The filter is therefore a LC-low pass filter.

Although such simple filters made only of chokes or of chokes and capacitors are able, in most applications, to bring the du/dt-value into a suitable range in order to avoid overvoltages due to reflections, they have an important drawback: the chokes themselves generate voltage overshoot at their output, which is then propagated up to the motor along the cable.

The voltage overshoot of the choke 10 can be explained in two different ways:

1) When the motor drive's output voltage quickly switches, the du/dt-filter's output voltage first remains unchanged and then changes relatively slowly towards a new drive output voltage value, thus slowing down the voltage switching speed. During this switching time there is therefore a voltage difference across the choke 10 and, according to basic circuit theory, a voltage across an inductor builds up a current to the choke according to the formula:

$$I = \frac{Ut}{L},$$

where I is the current, U is the voltage difference over the choke 10, t is the time and L is the inductance of the choke 10. On the other hand, when the filter's output voltage level finally reaches the desired output voltage level, i.e. the drive's output voltage, considerable current has been built up in the choke, in other words energy has been stored in the inductor 10, which can be calculated with $$E = \frac{1}{2}LI^2,$$

where E is the energy, L is the inductance of the choke 10 and I is the current. The current in the inductor 10, i.e. the energy stored in it, can't disappear instantaneously. The current thus has to continue flowing from the motor drive through the choke 10 to the filter's output capacitance 20 and/or to the cable's capacitance. This current flow will then cause the voltage overshoot by charging the output capacitances. When the output voltage of the filter reaches the drive's output voltage, a voltage gradually builds up across the choke 10 in the reverse direction to the direction of the voltage difference during the previous time period. This voltage difference gradually reduces the inductor's current toward zero. The inductor 10 is thus "reset".

2) The voltage overshoot can also be explained by the fact that the du/dt-filter is operated below LC-filters' natural resonant frequency. In other words, the switching frequency of the drive is lower than the resonant frequency of the LC-filter:

$$F_{res} = 1/2\pi\sqrt{LC}.$$

An alternative solution to the problem would be to set the filter's resonant frequency well below the motor drive's switching frequency. In this case, the voltage waveforms would not have time to go through all extremes, including the maximum voltage overshoot point. This solution is well known and called "sinus-filter", because it also smoothens the pulse width modulated voltage into a sinus waveform. However, for many applications a sinus-filter would be too expensive and bulky, and by filtering much more than a du/dt-filter it also negatively impacts the system's dynamic response.

The typical waveform of the output voltage of the du/dt-filter of FIG. 3 when connected to a drive having the output of FIG. 1 is shown in FIG. 4. It can be seen that the du/dt-value has been reduced in that the voltage rise time is longer as that of FIG. 1 or FIG. 2, but the peak voltage level is comparable with that of FIG. 2 which illustrates the case without any filter, due to the voltage overshoot of the choke 10 itself. The measured voltage overshoot of the choke 10 at the motor's end of the cable is illustrated in FIG. 5.

In most cases, this voltage overshoot can be reduced by so called damping resistors. Examples of prior art du/dt-filters using damping resistors are illustrated in FIGS. 6 and 10. Out of simplicity, the schematics illustrate one phase only of the possibly two, three or more phases of the filter.

In the prior art du/dt-filter illustrated in FIG. 6, the damping resistor 31 is connected in parallel with the choke 11. The voltage overshoot at the filter's output is reduced because a part of the energy which would otherwise charge the cable, represented by the output capacitance 41, is dissipated by the resistor 31 and because the damping resistor 31 also conducts the current from the choke's output back to the drive's output when the output capacitance 41 discharges and the choke's output voltage gets higher than its input voltage. However, while the discharge current is conducted by the resistor 31, the energy is turned into losses which can typically reach several hundreds of watts when such a damped du/dt-filter is operated with a 200 meters long cable and with switching frequencies around 10 kHz. Thus although a damping resistor 31 in parallel with the choke 11 effectively attenuates voltage overshoots at the filter's output, the power dissipation, or losses, in the resistor 31 is excessive as the cable is actually charged and discharged through it.

Moreover, as the parallel connection of two impedances leads to a lower resulting impedance value (R∥R=½R), the value of the inductor's impedance must be increased in order to obtain a sufficient resulting impedance for the desired du/dt reduction, thus implying the use of a generally larger and more expensive choke.

A further drawback of such prior art du/dt-filters is that their behavior strongly depends on the value of the cable's capacitance 41, which in turn depends on the cable's length. In other words, prior art du/dt-filters need to be designed, i.e. their components' characteristics need to be chosen, according to the intended cable length and/or to the value of the cable capacitance 41. The FIGS. 7, 8 and 9 show for example the output voltage's waveforms of a prior art du/dt-filter used with cables having different lengths. In these examples, a du/dt-filter according to the schematics of FIG. 6 is used with the typical values of 100 µH for the choke 11 and of 100 Ohm for the damping resistor 31.

In FIG. 7, the value of the cable's capacitance 41 is 1 nF, which corresponds to the typical capacitance of a short electric power cable. The output voltage's waveform is very satisfactory, in that the du/dt value is around 3750 V/µs and the maximal voltage overshoot isn't higher than 650 V. The waveform shown in FIG. 8 illustrates the output voltage when the same drive and motor are connected with a cable having a capacitance 41 of 10 nF, which corresponds to a medium length cable. The du/dt value is around 518 V/μs and the maximal voltage overshoot goes up to 800 V. FIG. 9 shows the waveform of the filter's output voltage when using a long cable having a capacitance 41 of 100 nF. The du/dt value is then of about 87 V/μs and the maximal voltage overshoot goes up to 1500 V. The above examples show that a prior art du/dt-filter designed to function with a certain cable, for example with a short cable, will give very different damping results when used with a medium or a long cable.

In the example of FIG. 10, the damping resistor 32 is connected in series with a filter's output capacitor 22. It thus doesn't "by-pass" the choke 12 and is connected in a similar way as that of an output charging element. The filter's output capacitance 22 thus discharges its energy to the ground over the damping resistor 32. However, this solution isn't effective in applications where the cable's ground-capacitance and/or phase-to-phase capacitance 42 is of a comparable magnitude as that of the filter's capacitance 22, which is the case in particular with long shielded (MCCMK) cables, because it doesn't attenuate the oscillations related to the energy exchange between the filter's choke 12 and the cable's capacitance 42, illustrated by the arrow in FIG. 10.

An alternative method is to clamp the voltage overshoot at the filter's output by using for example diodes 53 connected between the choke's 13 output and the drive's DC-link or an external storage for electrical energy 63 (FIG. 11). Apart of the low reliability and high cost of the diodes 53, the main drawback of this solution are the high magnitude and snappy currents related to voltage clamping, which is a violent voltage limitation. In other words, although the voltage waveform may seem acceptable at the filter's output, the currents may have rapid changes and oscillations leading to high electromagnetic interference. One particular problem with this solution is that the energy stored in the filter's chokes 13 during the reduction of the voltage switching speed du/dt generates a so called free wheeling current flowing from the DC-link 63 through the choke 13 and the diodes 53 and back to the DC-link 63. This free wheeling current may for example corrupt the motor estimation measurements done by the motor drive and as well as generating considerable energy losses within the diodes 53. Furthermore, such a clamping circuit is an ON/OFF-type switch: a diode's impedance theoretically switches between zero and the infinite. These impedance values don't provide impedance matching, neither with the cable nor with the motor.

An aim of the present invention is to propose a filter network for reducing the voltage switching speed du/dt generating no or very low overvoltages.

Another aim of the present invention is to propose a filter network for reducing the voltage switching speed du/dt with lower power losses than that of prior art networks.

Still another aim of the present invention is to propose a compact filter network with low complexity for reducing the voltage switching speed du/dt.

Still another aim of the present invention is to propose a filter network for reducing the voltage switching speed du/dt having a low cable length dependency.

Still another aim of the present invention is to propose a low cost filter network for reducing the voltage switching speed du/dt.

BRIEF SUMMARY OF THE INVENTION

These aims are achieved by a filter network having the characteristics of the corresponding independent claims, further advantageous embodiments being given by the dependent claims.

In particular, these aims are achieved by a filter network for the reduction of the voltage switching speed between an electrical motor drive and an electrical motor and/or between an electrical distribution network and a motor drive, comprising for each electrical phase a self-damped inductor having a complex impedance determined by a magnitude and a phase, the phase of the complex impedance being comprised between 80 and 90 degrees in the frequency range of the motor's current, and being comprised between 0 and 60 degrees in the frequency range of the overvoltage oscillations.

In particular, these aims are also achieved by a filter network for the reduction of the voltage switching speed and/or of overvoltage oscillations between an electrical motor drive and an electrical motor and/or between an electrical distribution network and a motor drive, comprising for each electrical phase a self-damped inductor having a complex impedance determined by a magnitude and a phase, wherein the difference between the highest value and the lowest value of the complex impedance's phase in the frequency range of the overvoltage oscillations is smaller than ten degrees.

In particular, these aims are also achieved by a matching network for the reduction of the voltage switching speed between an electrical motor drive and an electrical motor, comprising for each phase a self-damped inductor having a complex impedance comprising an inductive and a resistive part, wherein the magnitude of the inductive part is larger than the magnitude of the resistive part in the frequency range of the motor's current, and the magnitude of the resistive part is larger than the magnitude of the inductive part in the frequency range of the overvoltage oscillations.

Using the inventive filter network, it is possible to manufacture low cost and small size du/dt-filters generating low voltage overshoot and low losses.

BRIEF DESCRIPTION OF THE DRAWINGS

The invention will be better understood with the help of the following description illustrated by the figures, where.

Previously discussed

DETAILED DESCRIPTION OF THE PREFERRED EMBODIMENTS OF THE INVENTION

Figure 12:
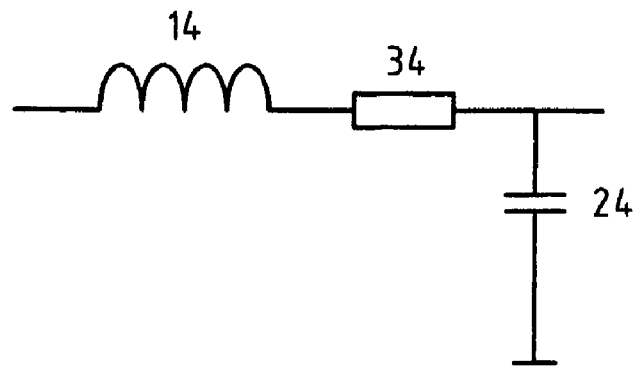
FIG. 12 is a schematic of the inventive filter network in the frequency range of the overvoltage oscillations.

According to the invention, the optimal location for a damping resistor 34 in order to attenuate the overvoltage oscillations generated by a du/dt-filter essentially consisting of a choke 14, is in series with the choke 14 as illustrated in the schematics of FIG. 12. In such a configuration, the impedance of the resistor 34 and the impedance of the inductor 14 both contribute to the reduction of the voltage switching speed du/dt. Moreover, the oscillations related to the energy exchange between the filter's choke 14 and the filter's capacitance 24 and/or the oscillations related to the energy exchange between the filter's choke 14 and the not represented cable's capacitance are all efficiently attenuated by the resistor 34.

The voltage difference across the inventive filter network schematically represented in FIG. 12 is distributed over the resistor 34 and the inductor 14. The energy related to the voltage portion appearing across the resistor 34 will be dissipated into losses, thus damped, while only the portion of the voltage present across the inductor 14 will increase the current in it and generate voltage overshoot. Thanks to the location of the resistor 34 in series with the inductor 14, the voltage overshoot at the inductor's output will thus be significantly reduced compared to that generated under similar conditions in prior art du/dt-filters.

In practice, however, no conventional resistor can be connected directly in series with the choke 14 because the motor's current, also known as load current, which typically has a frequency of 50 Hz and an amplitude of 12 to 300 A rms for example, would generate unacceptable losses in the damping resistor. According to the invention, the damping resistor 34 connected directly in series with the choke 14 is seen only by the overvoltage oscillations, in that for example its value depends on the frequency. More precisely, in the frequency range of the motor's current which usually lies between 0 and 100 Hz, going up to 2 kHz in specific applications, the impedance of the resistor 34 should be negligible, close to zero. The filter network according to the invention should thus be entirely inductive. Around the frequencies of overvoltage oscillations, however, the filter network should have considerable, or even preferably dominant, resistive characteristics in order to damp the oscillations. In such a configuration, the inductive and resistive portions of the filter network both contribute to the damping effect and the desired output voltage is obtained with a choke having a lower inductance value, thus with a choke of lower size and cost, than that required for obtaining the same effect with a prior art du/dt-filter having a parallel damping resistor for example.

According to a preferred embodiment of the invention, the frequency-dependant resistive characteristics of the filter network are preferably integrated into the choke itself, resulting into a single component which could be called a self-damped choke or self-damped inductor.

Preferred frequency-dependant impedance specifications for the self-damped choke are summarized in the table below. The inventive self-damped choke is inductive, i.e. the phase of its impedance is close to 90 degrees, in the frequency range of the motor's current, but it becomes resistive, i.e. the phase of its impedance becomes smaller than 60 degrees, in the frequency range of the overvoltage oscillations.

| Issue | Typical frequency range | Required impedance |
| --- | --- | --- |
| Motor current | 0 to 100 Hz (up to 2 kHz in special cases) | Inductance |
| Switching frequency | 2 kHz to 16 kHZ (fundamental frequency) | Inductance/ resistance |
| Overvoltage oscillations | typically around 100 kHz and higher | Resistance |

Practical realization of the inventive self-damped choke will be further discussed.

Every electrical conductor has some inductance associated with the magnetic field induced by the current in it. In order to increase the inductance or to reduce the volume, a conductive wire is usually wound into multiple turns, thus into a solenoid or air-core choke. In order to further increase the inductance or to further reduce the size, some magnetic material, i.e. a material with relative permeability greater than one, can be inserted into magnetic coupling with the winding consisting of the wound conductive wire. According to the invention, the characteristics of both core material and winding can be used to adjust the frequency-dependant impedance characteristics of the self-damped inductor.

According to a preferred embodiment of the invention, the inventive filter network inserted between the motor drive's output and the cable's input comprises, for each phase, a self-damped inductor consisting of a coil of a conductive material, for example copper wire, wound around a magnetic core made of a magnetic material having resistive characteristics at the frequencies where damping is needed, such that the frequency-dependant resistive characteristics of the self-damped inductor are provided by the frequency-dependant permeability characteristics of the core material.

The permeability of any core material can be expressed as a complex value consisting of a real and of an imaginary part. The relative magnitude of these parts within a certain frequency range determine whether an inductive component using this core material will be inductive, resistive or a combination of both at that frequency range. In prior art inductors, the core material is chosen such that the inductor has a dominating inductive behavior within the working frequency range in order to obtain the desired inductance while minimizing the energy losses within the choke.

According to a preferred embodiment of the invention, the permeability of the core material used for building the self-damped inductor is modified, for example by changing the material's composition, the pressing force used for its manufacturing and/or the sintering temperature, in order to obtain the desired frequency-dependant permeability characteristics.

Figure 13:
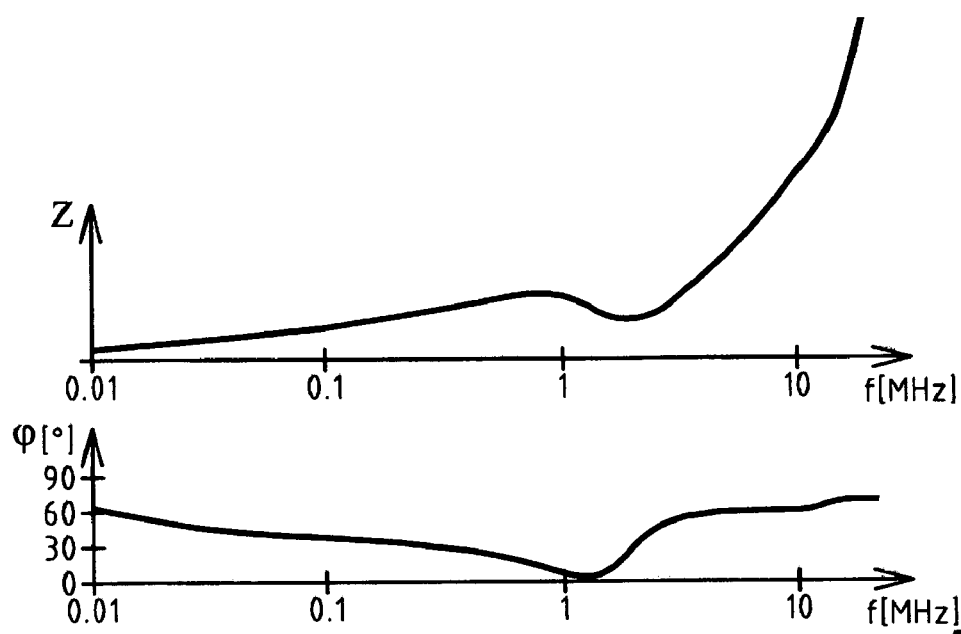
FIG. 13 illustrates the measured magnitude and phase of the impedance of a filter network according to a preferred embodiment.

Experiments have been conducted for example with a self-damped inductor consisting of a winding of copper wire wound around a toroïdal core manufactured with Somaloy 500 iron powder from Höganäs (Sweden) at a pressure of 800 Mpa and sintered at 500 Deg Celsius for 30 minutes. The frequency-dependant impedance characteristics of this self-damped inductor are represented in FIG. 13, where the magnitude Z of the impedance is plotted in the top plot while the phase $\phi$ of the impedance is plotted in the bottom plot. A phase $\phi$ close or equal to 90 degrees illustrates an inductive behavior of the inventive self-damped inductor, while a phase $\phi$ close or equal to 0 degrees illustrates a resistive behavior. Between these two extremes, when the phase $\phi$ varies between 0 and 90 degrees, the impedance of the self-damped inductor is a combination of inductive and resistive impedances. Such an impedance is called a complex impedance and the inductive and the resistive components are called the imaginary and the real components respectively. The imaginary, or inductive, component determines the energy stored into choke while the real, or resistive, component determines the energy losses, or damping.

As an example, the plot of FIG. 13 illustrates a case where the impedance of the self-damped inductor at 10 kHz has a phase $\phi$ of approximately 64 degrees, thus the component is mainly inductive but it has a considerable resistive component as well. Experiments conducted within the frame of the present invention have shown that satisfactory overvoltage oscillations' damping can be achieved within any frequency range where the phase of the self-damped choke is comprised between 0 and 60 degrees.

In the example illustrated in FIG. 13, the impedance of the self-damped inductor becomes more and more resistive as the frequency increases: at 100 kHz, the phase $\phi$ is approximately 38 degrees, i.e. the resistive component already dominates, and at a frequency of 1 Mhz, the phase $\phi$ is around 7 degrees which corresponds to the phase of an almost entirely resistive component. The material manufactured for this experiments thus has the frequency-dependant permeability characteristics required for building a self-damped inductor according to a preferred embodiment of the invention and having the frequency-dependant behavior described in the table above.

Figure 14:
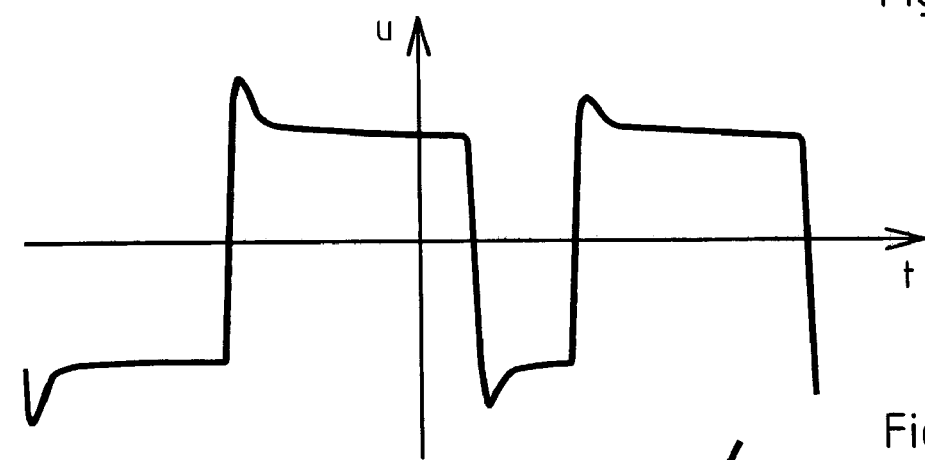
FIG. 14 is the measured voltage at the motor's input when using a filter network according to the invention between the drive and the motor.

FIG. 14 represents the voltage u measured at the motor's input when a filter network, consisting of one inventive self-damped inductor having the characteristics illustrated in FIG. 13 for each phase, is inserted between the motor drive's output and the cable's input. In this example, the switching speed du/dt is reduced to the desired value of 264V/μs and the overshoot voltage is damped very effectively as it doesn't go over 656V.

Such an effective operation can be explained through impedance matching. It can be noted that the impedance characteristics of the core material is very similar to the typical frequency-dependant impedance of a motor. It can thus be stated that the impedance of the self-damped choke as illustrated for example in FIG. 13 matches the impedance of the drive to the impedance of the motor at all frequencies.

Figure 15:
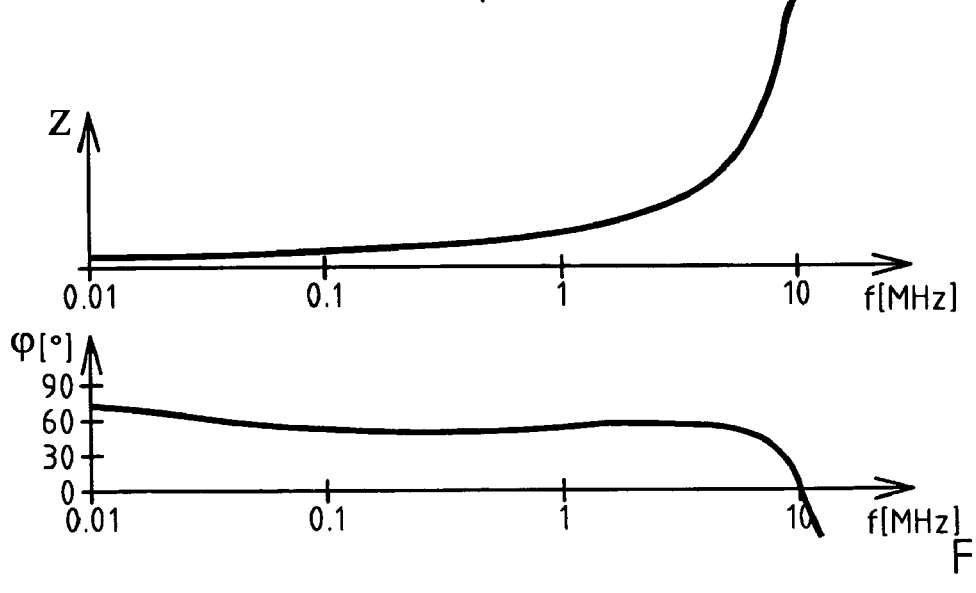
FIG. 15 illustrates the measured magnitude and phase of the impedance of a filter network according to a variant embodiment.

According to a variant embodiment, the frequency-dependent resistive behavior of the inventive self-damped choke is chosen to increase more or less proportionally to the frequency within a wide frequency range, at least over one decade, preferably over two decades or more, instead of increasing dramatically as shown in the previous embodiment. The inductive part also increasing proportionally to the frequency, the phase $\phi$ of the choke's complex impedance remains more or less constant over this entire wide frequency range, as illustrated in FIG. 15 where the phase $\phi$ of the choke's complex impedance is more or less constant and remains for example below 60 degrees within a frequency range going from 100 kHz up to 5 MHz. According to this variant embodiment, the difference between the phase's highest value and the phase's lowest value within this wide frequency range is thus smaller than 10 degrees, preferably smaller than 5 degrees. As the filter network's damping characteristics are proportional to the value of its impedance's phase $\phi$, the damping and therefore the maximal voltage overshoot are more or less constant over the entire wide frequency range. As illustrated below, the du/dt value of the damped signal however varies with the frequency.

Figure 1:
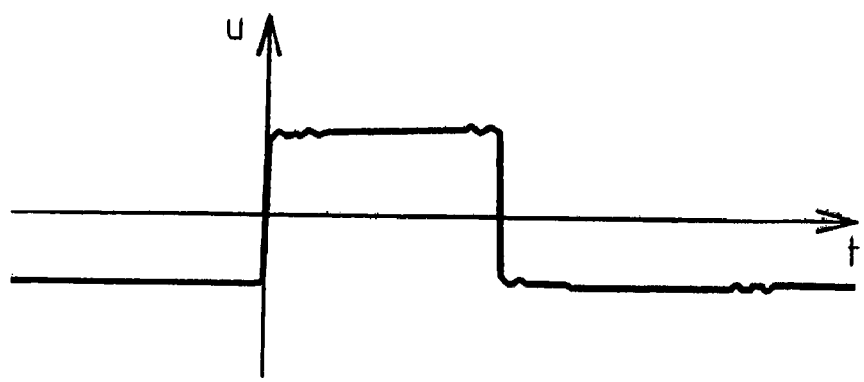
FIG. 1 illustrates a typical ASD drive's output voltage waveform, Previously discussed
Figure 2:
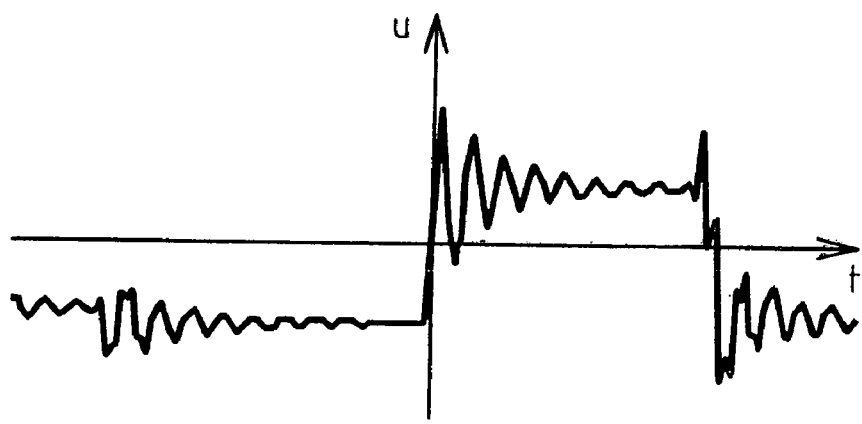
FIG. 2 is the measured voltage at the motor's input, using a long cable from the drive to the motor, Previously discussed
Figure 3:
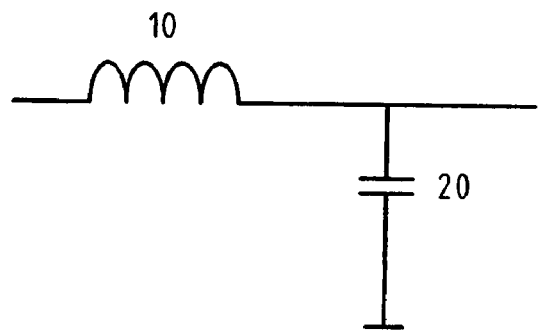
FIG. 3 is a prior art du/dt-filter, Previously discussed
Figure 4:
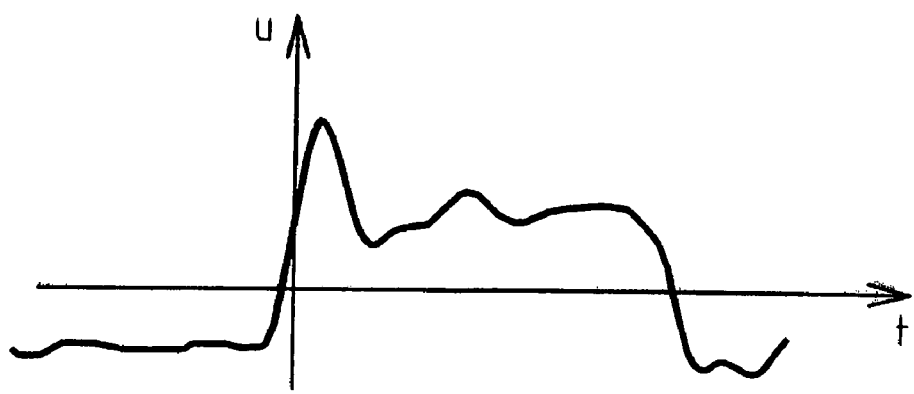
FIG. 4 is the typical non-damped output voltage of a prior art du/dt-filter, Previously discussed
Figure 5:
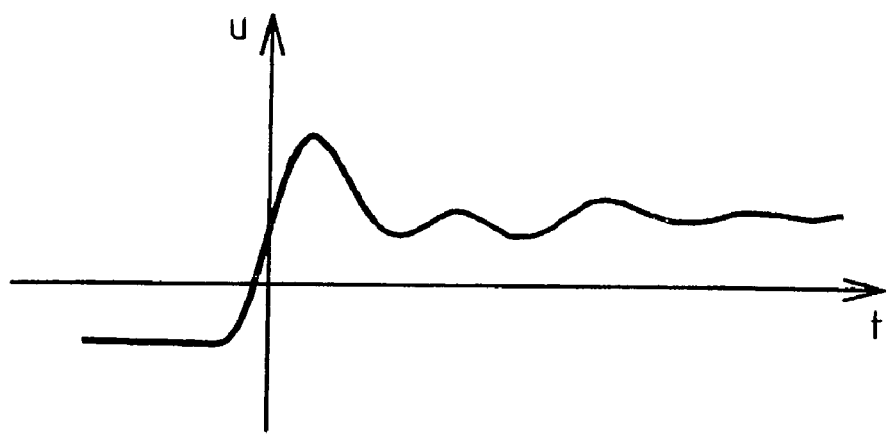
FIG. 5 is the measured voltage at the motor's input, using a prior art du/dt-filter, Previously discussed
Figure 6:
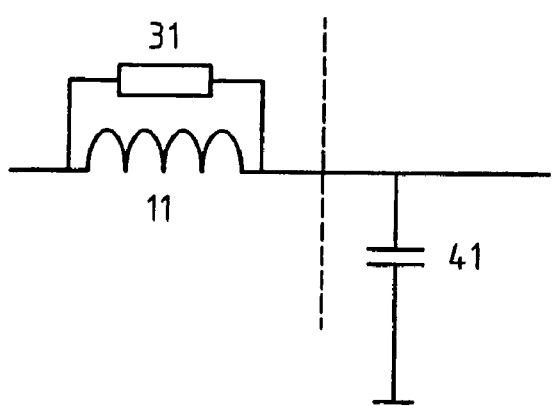
FIG. 6 is a prior art du/dt-filter with a damping resistor parallel to the choke, Previously discussed
Figure 7:
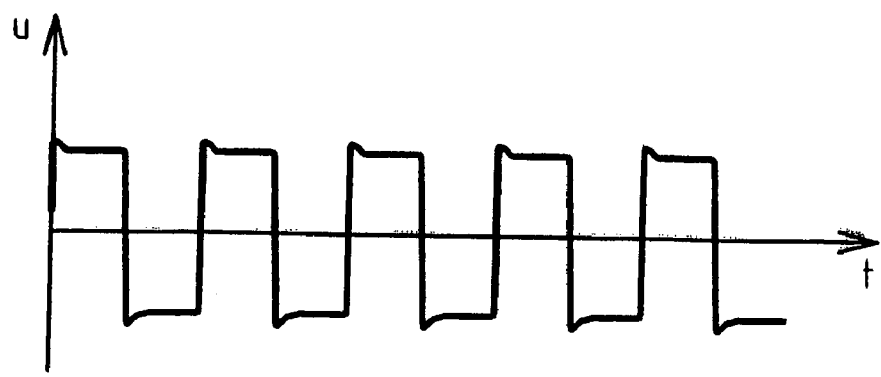
FIG. 7 shows the output voltage's waveform of a prior art du/dt-filter used with a short cable, Previously discussed
Figure 8:
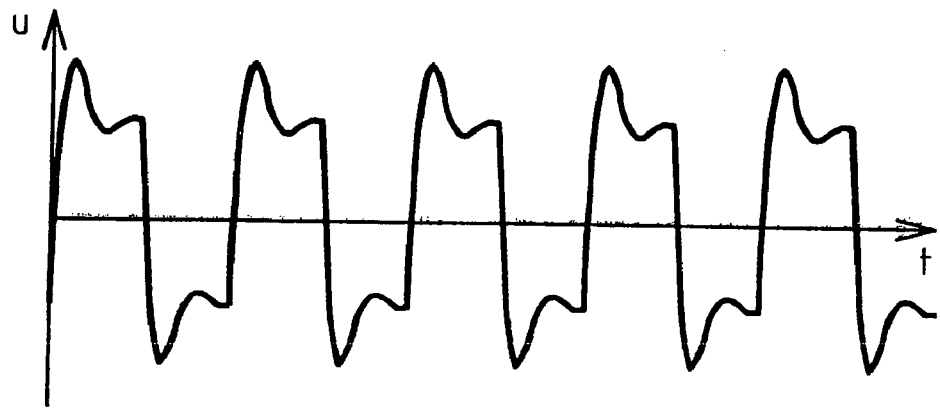
FIG. 8 shows the output voltage's waveform of a prior art du/dt-filter used with a medium cable, Previously discussed
Figure 9:
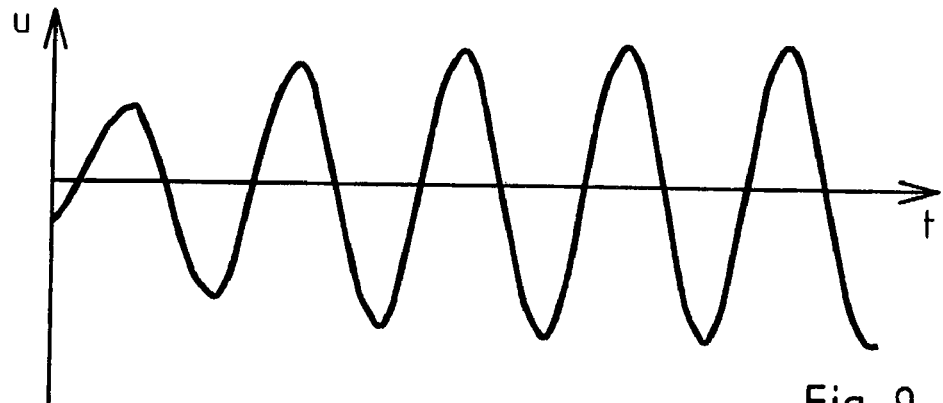
FIG. 9 shows the output voltage's waveform of a prior art du/dt-filter used with a long cable, Previously discussed
Figure 10:
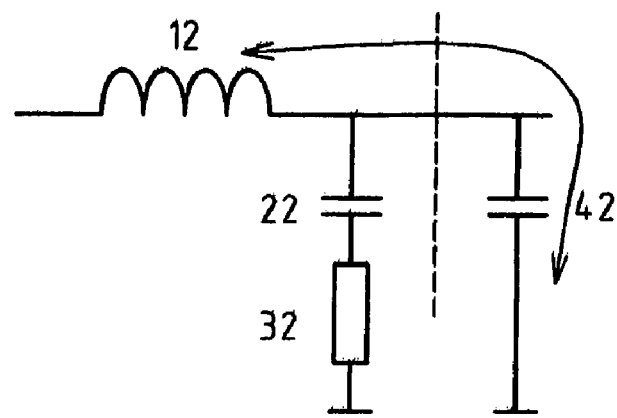
FIG. 10 is a prior art du/dt-filter with a damping resistor in series with a capacitor, Previously discussed
Figure 11:
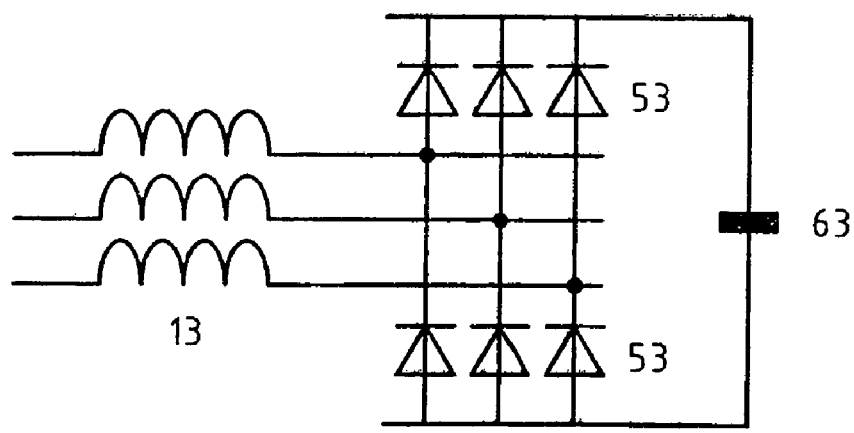
FIG. 11 is a prior art clamping circuitry.
Figure 16:
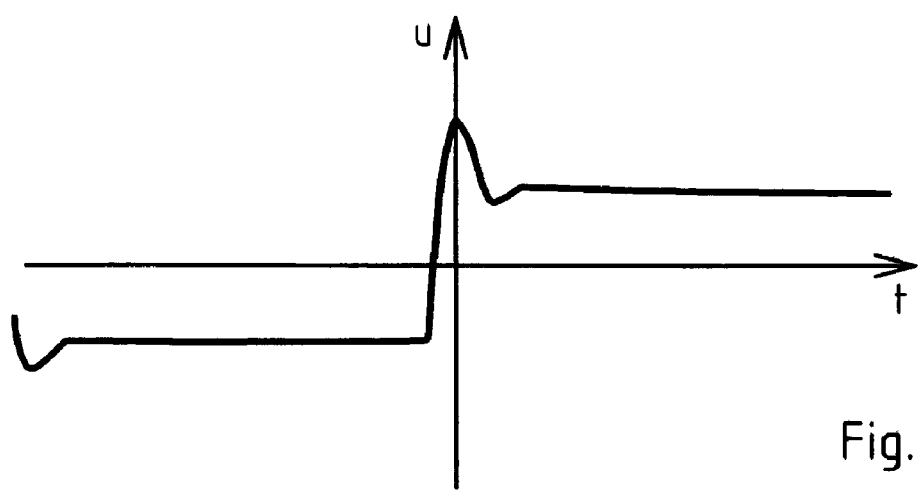
FIG. 16 shows the output voltage's waveform of a filter network according to a variant embodiment used with a short cable.
Figure 17:
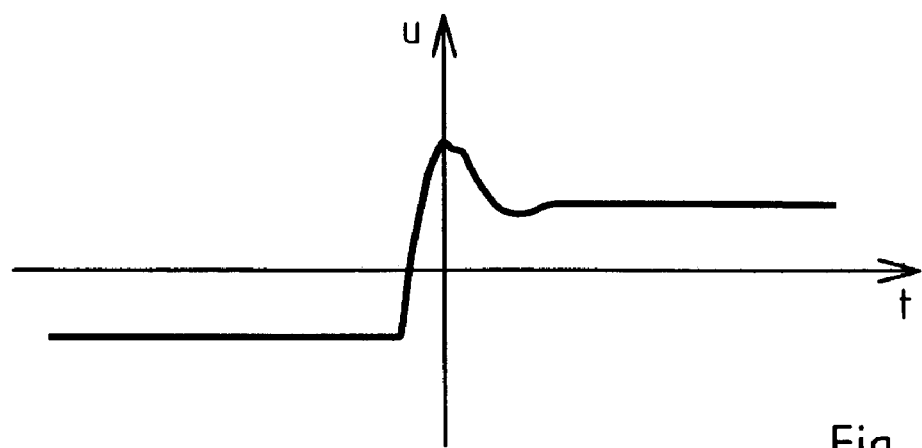
FIG. 17 shows the output voltage's waveform of a filter network according to a variant embodiment used with a long cable.

Self-damped chokes having such a behavior allow building filter networks with very low cable dependency, thus avoiding the disadvantages of prior art du/dt-filters as illustrated by the FIGS. 7 to 9. The output voltage of one phase of such a filter network is plotted in FIG. 16 when used with a short cable and in FIG. 17 when used with a long cable. One can see from these examples that although the du/dt value is lower in the case of a long cable, the voltage overshoot is equivalent in both cases. The inventive filter network thus provides for optimized overvoltage damping over a wide frequency range, thus also minimizing the losses.

Magnetic materials used for the magnetic core of prior art inductors also have some damping properties provided by their frequency-dependant impedance characteristics, but this damping is mostly insufficient for building self-damped inductors and filter networks according to the invention. As opposed to the prior art practice in the manufacturing of inductors, magnetic component design and processing in order to manufacture filter networks according to the invention should be optimized from a damping point of view. Component design including for example material selection, geometry selection, air gap shape and dimension selection, winding design, etc.

In another variant embodiment, the filter network according to the invention inserted between the motor drive's output and the cable's input comprises, for each phase, a self-damped inductor consisting of a coil of a conductive material, for example copper wire, wound around a magnetic core made of a magnetic material having resistive characteristics at the frequencies where damping is needed, such a that the frequency-dependant resistive characteristics of the self-damped inductor are provided by the frequency-dependant resistance of the winding, i.e. by its AC-resistance.

The AC-resistance of the winding is a known parameter in the design of high frequency magnetic components such as transformers and chokes for examples, and it is usually minimized in order to reduce losses and thus obtain maximum efficiency. The AC-resistance of the winding is the result of the combination of the skin, proximity and edge effects. By proper selection of the winding's material, thickness, shape and/or composition, the desired impedance characteristics can be designed into the choke.

The skin effect relates to the fact that, at higher frequencies, the current only flows at the surface of a conductor. The resistance of the conductor thus increases with the frequency as the current uses an always smaller part of the conductor's section. The proximity effect relates to the fact that the current flowing in the adjacent conductors further emphasize the skin effect. The edge effect is usually noted in foil windings where the current crowds into fold edges at high frequencies, thus AC-resistance is somewhat increased.

Experiments have been conducted for example to realize a self-damped inductor according to the invention with air-core chokes wound using multiple layers of a 0.5 mm thick copper foil. Such a self-damped inductor is mainly inductive at a typical motor's frequency, as its resistance is only equal to the low winding's DC-resistance. With increasing frequency however, the resistive part of the inductor's impedance increases up to 100 to 1000 times, depending mainly on the material and geometry details and on the exact geometry, due to the high frequency winding loss mechanisms explained above, that are the skin, proximity and edge effects. The inductive part of the impedance is simultaneously slightly reduced as the high frequency magnetic field cannot penetrate into the windings, thus the impedance's phase is becoming more resistive.

Figure 18:
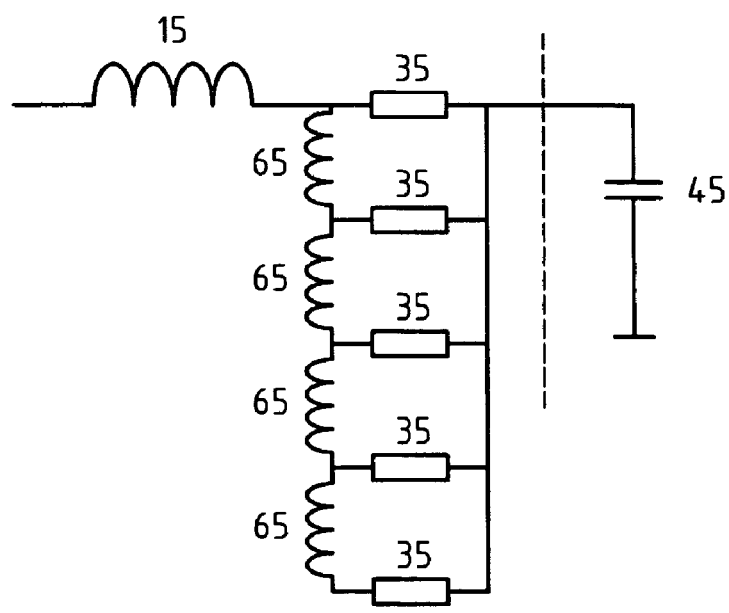
FIG. 18 is a schematic of a filter network according to another embodiment of the invention.

A principle schematic of a winding with AC-resistance is illustrated in FIG. 18. The schematic illustrates that the DC-current (0 Hz) flows through the whole conductor area, as the parallel connection of all resistors 35 results into a small resulting resistance, but a current at higher frequency sees the impedance of the inductors 65 and will only flow through some of the first resistors 35 only, which corresponds to the fact that a smaller conductor's area results into a higher resistance. The schematic showing a plurality of discrete elements 15, 35, 65 is only illustrative, in practice this phenomenon happens of course in one and same electrical element which is the inventive self-damped inductor. The capacitance 45 illustrates the cable.

The one skilled in the art will understand that it is possible to generate a filter network combining both damping mechanisms described above: the use of a core material as described first and the winding's AC-resistance.

It is also possible and it may even be desirable to complete the inventive filter network by connecting other electrical components and/or circuits in series and/or in parallel with the self-damped inductor according to the invention. Each phase of the filter network can for instance be completed for adaptation and/or tuning purposes in that a capacitance is connected between the output of the inventive self-damped inductor and for example the ground, another phase or the neutral conductor. According to the invention, oscillations which could arise from the energy exchange between the self-damped inductor and the filter's capacitance are efficiently attenuated thanks to the resistive behavior of the inventive self-damped inductor itself.

Self-damped chokes according to invention are preferably intended to be used in multiphase systems such as for example three-phase systems frequently used in standard motor drives. It can thus be designed to have magnetic coupling between the different phases, for example in that the self-damped chokes of different phases share the same magnetic core.

According to a preferred embodiment of the invention, the self-damped inductor is built as an integrated inductive component having the frequency-dependant impedance characteristics illustrated in the table above. The one skilled in the art will however recognize that the self-damped inductor can also be constituted of two discrete elements, for instance of a discrete inductor connected for example in series with a discrete resistor having frequency-dependant resistive properties, the resulting impedance of the circuit having then the desired frequency-dependant impedance.

The one skilled in the art will also recognize that the filter network according to the invention can either be built as a separated filter or it can be integrated into the motor drive itself, into the cable or into the motor.

The magnetic core of a self-damped inductor according to the invention can be designed in such a way that it has enhanced cooling capacity by thermal conduction to a heatsink or to an enclosure, by direct natural or forced convection to air, by heatpipe or by liquid cooling.

Other damping networks known from prior art can also be used together with a filter network according to the invention if desirable for optimum performance.

In the above examples, the inventive filter network is used for damping overvoltages between the drive and the motor. Experiments conducted within the frame of the present invention showed however that the inventive filter network can also be implemented for damping voltage overshoots between the drive and the electrical distribution network to which it is generally also connected with an electric power cable. While operating, the motor drive generates disturbances in the form of overvoltages on its network side also. These voltage overshoots need to be at least partially filtered in order to avoid other electric appliances connected to the same network from being perturbed or even destroyed. Experiments have led to the surprising result that these voltage overshoots are also efficiently damped or even eliminated when a filter network according to the present invention is connected between the motor drive and the electrical distribution network.

The invention claimed is:

1. A filter network for the reduction of voltage switching speed and of overvoltage oscillations between an electrical motor drive and an electrical motor and/or between an electrical distribution network and a motor drive, comprising for each electrical phase a self-damped inductor having a complex impedance determined by a magnitude and a phase, wherein the behavior of said self-damped inductor is such that the difference between the highest value of said phase of said complex impedance in a frequency range of the overvoltage oscillations and a lowest value of said phase of said complex impedance in said frequency range of the overvoltage oscillations is smaller than 10 degrees.

2. The filter network of claim 1, wherein said phase remains essentially constant over at least two decades in the frequency range of the overvoltage oscillations.

3. The filter network of claim 1, said difference being smaller than 5 degrees.

4. The filter network of claim 1, said frequency range of the overvoltage oscillations comprising frequencies from 100 kHz to 5 MHz.

5. The filter network of claim 1, said phase of said complex impedance being less than 60 degrees in said frequency range of the overvoltage oscillations.

6. The filter network of claim 1, said self-damped inductor being built as one discrete component.

7. The filter network of claim 6, said self-damped inductor comprising at least one winding of a conductive material.

8. The filter network of claim 7, said self-damped inductor further comprising a magnetic core out of a magnetic material coupled with said at least one winding.

9. The filter network of claim 8, the characteristics of said complex impedance being induced by frequency-dependant permeability characteristics of said magnetic material.

10. The filter network of claim 8, the characteristics of said complex impedance being induced by the AC-resistance of said at least one winding.

11. The filter network of claim 1, said self-damped inductor comprising a discrete inductor and a discrete resistor having frequency dependent resistive characteristics.

12. The filter network of claim 11, said inductor being connected to the drive end of said self-damped inductor, said resistor being connected to the motor or network end of said self-damped inductor.

13. The filter network of claim 1, further comprising a capacitor at the motor or network end of said self-damped inductor.

14. The filter network of claim 1, for use in a three-phase electrical system.

15. The filter network of claim 14, comprising three self-damped inductors.

16. The filter network of claim 15, said three self-damped inductors being magnetically coupled.

17. An electrical system comprising a motor drive, a filter network for the reduction of voltage switching speed and of overvoltage oscillations between an electrical motor drive and an electrical motor and/or between an electrical distribution network and a motor drive, comprising for each electrical phase a self-damped inductor having a complex impedance determined by a magnitude and a phase, wherein the behavior of said self-damped inductor is such that the difference between the highest value of said phase of said complex impedance in a frequency range of the overvoltage oscillations and a lowest value of said phase of said complex impedance in said frequency range of the overvoltage oscillations is smaller than 10 degrees, at least one cable and a motor.

18. The electrical system of claim 17, said at least one filter network being connected between said motor drive and said cable and/or between said motor drive and an electrical distribution network.

19. The electrical system of claim 17, said filter network being integrated within said at least one cable.

20. The electrical system of claim 17, being a three-phase electrical system.

* * * * *